United States Patent [19]

Morgan

[11] 4,072,077
[45] Feb. 7, 1978

[54] PRINTED CIRCUIT BOARD PROTECTOR

[75] Inventor: John H. Morgan, Albuquerque, N. Mex.

[73] Assignee: GTE Automatic Electric Laboratories Incorporated, Northlake, Ill.

[21] Appl. No.: 689,444

[22] Filed: May 24, 1976

[51] Int. Cl.² .................... B23D 33/02; B26D 7/06
[52] U.S. Cl. .................................. 83/418; 83/421; 83/422; 83/425; 83/435.1; 83/925 R; 83/409.2; 29/566.3
[58] Field of Search ................. 83/425, 418, 420, 421, 83/422, 435.1, 580, 409.2, 925 R; 29/566.3

[56] References Cited
U.S. PATENT DOCUMENTS

| 2,439,657 | 4/1948 | Hexter et al. | 83/732 |
| 3,307,442 | 3/1967 | Imhoff | 83/580 |
| 3,791,247 | 2/1974 | Pretz | 83/418 |
| 3,798,734 | 3/1974 | Fedor | 29/566.3 |
| 3,866,293 | 2/1975 | Nijman | 29/566.3 |

Primary Examiner—Donald R. Schran
Attorney, Agent, or Firm—Russell A. Cannon; Leonard R. Cool

[57] ABSTRACT

Printed circuit boards are moved in a conveyor with the underside of flat boards spaced a prescribed distance above the top surface of a rotating cutting disk. In order to protect the circuit patterns on the underside of the board and the board itself, a V-shaped wheel is loosely rotatably supported on a shaft with the wheel being in front of and orthogonal to the cutting disk. The height of the wheel is adjusted such that the uppermost point on the circumference thereof is in the line of travel of the boards. Movement of a board that is bowed downward in the direction of the disk causes the wheel to roll on the underside of the board and to raise the board above the top of the cutting disk. In this manner, the underside of warped circuit boards is maintained at least a prescribed distance above the top surface of the cutting disk as the board moves over the leading - cutting edge of the latter and component leads are trimmed thereby. Weak compression springs on either side of the wheel allow it to move sideways when it contacts a component lead. The spacing between the wheel and the front edge of the cutting disk is also adjustable.

31 Claims, 5 Drawing Figures

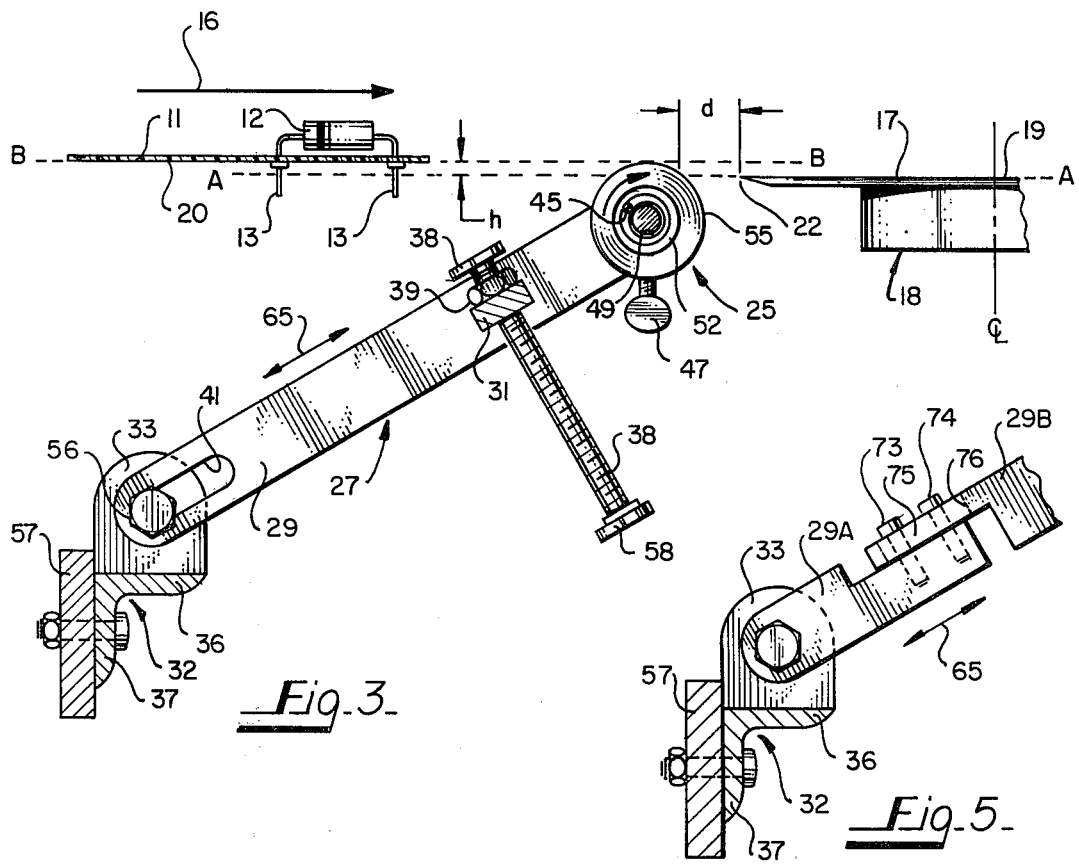
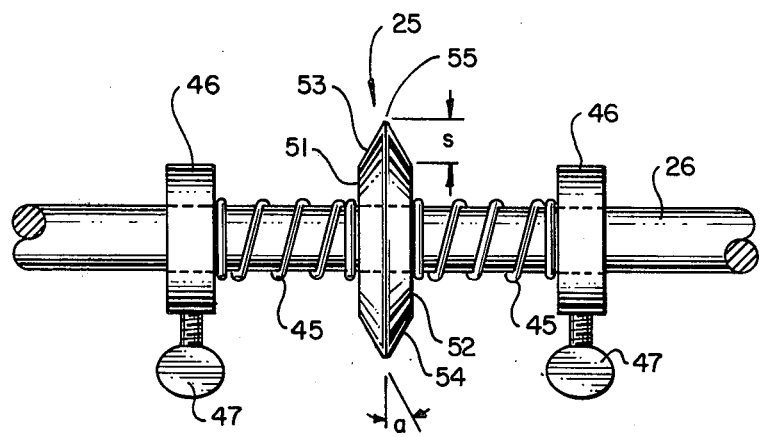

PRINTED CIRCUIT BOARD PROTECTOR

BACKGROUND OF INVENTION

This invention relates to trimming component leads on the underside of printed circuit boards and more particularly to apparatus for rendering warped circuit boards more nearly flat as they pass over the leading edge of a rotating cutting disk for trimming component leads thereon.

Assembly of printed circuit (PC) boards includes inserting component leads into holes in the circuit board with the leads extending past the underside thereof. These partially assembled circuit boards can then be loaded into a conveyor and passed through a flow-solder machine to complete electrical and mechanical connections of components in the printed circuits. In an automated assembly process, the conveyor may carry the boards directly from the flow-solder operation to an automatic lead trimmer which cuts excess length from the component leads. A typical lead trimmer comprises one or more cutting disks which are located parallel to and a prescribed distance below the underside of the circuit board in the conveyor. It has been found that either through adverse storage conditions, heat during the soldering operation, the large width of a particular board, or initial manufacturing of the laminates of a board, that some boards are either permanently warped or will become warped in the conveyor. In some instances, the underside of the cutting disk will contact and damage printed circuitry on the underside of a warped board and/or the board itself.

SUMMARY OF INVENTION

An object of this invention is the provision of apparatus for reducing the likelihood of the underside of a printed circuit board contacting the leading edge of a rotating cutting disk as the board is moved over the disk.

In accordance with one embodiment of this invention, a V-shaped wheel is located in front of and orthogonal to one plane containing the top surface of a rotating cutting disk. The wheel is positioned such that a line tangent to the circumference of the wheel is located adjacent to and a distance away from the one plane and the top surface of the cutting disk, other portions of the wheel being on the side of the tangent line that is toward the one plane. Flat circuit boards are moved over the cutting disk with the undersides thereof in a second plane containing the tangent line in order to trim excess length from component leads projecting from the undersides of the boards. Movement of circuit boards that are bowed in the direction of the disk cause the wheel to rotate and exert pressure on the undersides of the board. This pressure straightens the boards before they pass over the leading edge of the disk, and component leads are cut. The wheel is supported so that it can move laterally when and if it contacts a component lead.

BRIEF DESCRIPTION OF DRAWINGS

This invention will be more fully understood from the following detailed description of preferred embodiments thereof wherein:

FIG. 3 is generally a side view of the progressive line and frame 27 taken along lines 3—3 in FIGS. 1 and 2;

FIG. 4 is a view of a portion of the frame structure 27 taken along line 4—4 in FIG. 2; and FIG. 5 is a side view of a portion of arm 29 in an alternate embodiment of the frame 27.

DESCRIPTION OF PREFERRED EMBODIMENTS

Figure 1:
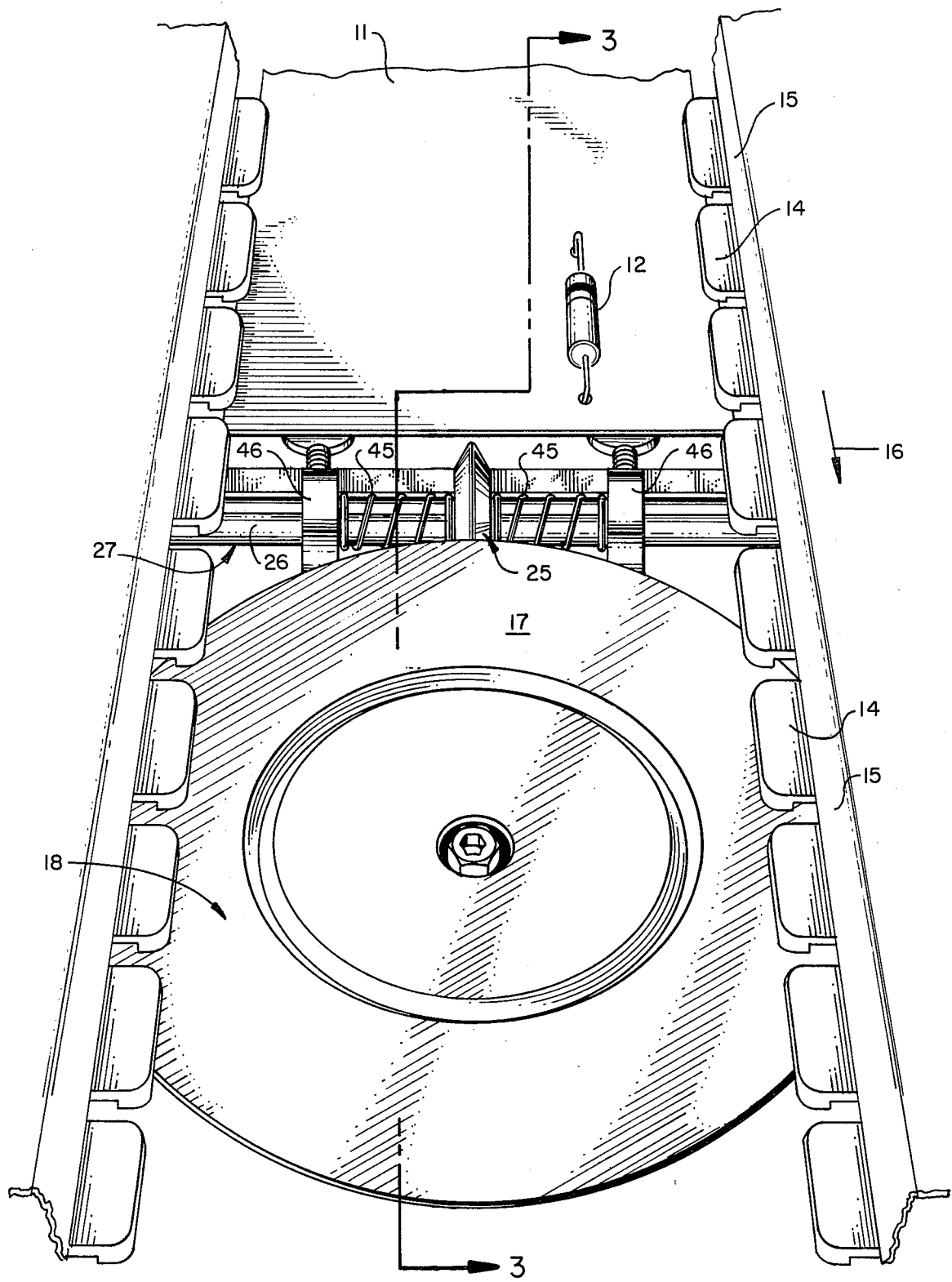
FIG. 1 is a top view of a progressive printed circuit board manufacturing line including this invention.

Referring now to FIG. 1, a printed circuit board 11 having a plurality of components 12 thereon (only one component 12 being shown here for clarity of illustration) is supported in links 14 of a conveyor 15 which moves the board 11 in the direction of arrow 16. The board 11 may be a presoldered printed circuit board which is loaded onto the conveyor 15 for lead trimming or it may be coming directly from a wave soldering machine (not shown). The conveyor 15 moves the boards 11 over the rotating cutting disk 17 of a lead trimmer 18. As is illustrated in FIG. 3, the disk 17 is located so that the top surface 19 thereof is spaced a prescribed distance $h$ below the underside 20 of a circuit board 11 that is flat. If the board 11 in a conventional system is warped sufficiently, the underside 20 thereof may contact the leading (cutting) edge 22 of disk 17 and damage the printed circuit pattern on and/or the board 11 itself. In accordance with this invention, a V-shaped wheel 25 is loosely laterally supported on a shaft 26 in front of the cutting disk 17. The height of wheel 25 is such that it raises the underside 20 of a warped circuit board 11 to a height that is above the top surface 19 of disk 17 before the board passes over the leading edge 22 thereof.

The wheel 25 is supported in a frame 27 which comprises a pair of arms 29 and 30, a crossbar 31 which is rigidly secured to both of the arms 29 and 30 at points spaced from the ends thereof, the shaft 26 on which the wheel 25 is rotatably mounted, and an angle iron beam 32 having three flanges 33 - 35 secured to the same side or leg 36 thereof. The crossbar 31 has an adjustment screw 38 threadably mounted in a hole therethrough. The arms 29 and 30 have holes 40 and elongated slots 41 in opposite ends thereof. The shaft 26 is releasably secured in the holes 40 of the arms 29 and 30 such as by Allen screws 43. The wheel 25 fits over the shaft 26 and has a weak compression spring 45 and lock ring 46 on either side thereof. The wheel 25 is preferably centered on the shaft 26 with the springs 45 loosely compressed between the two lockrings 46 prior to tightening the thumb screws 47 on the rings 46 to initially fix the lateral position of the wheel.

The wheel 25 preferably has a ball-bearing insert in a central opening thereof to facilitate rotation of the wheel on shaft 26. The bearing, and thus the wheel member, has an oversized hole 49 therein for providing a loose clearance fit between the inner surface of the bearing and the shaft 26 which enables the wheel to wobble, thus permitting it to readily move laterally if it should come in contact with a component lead 13. Otherwise, the printed wiring board would be forced upward, causing objectionable lead length variations. As is illustrated most clearly in FIG. 4, the side portions 51 and 52 of the wheel are flat and parallel to each other over approximately the central half of the radius of the wheel. This provides smooth, flat, and parallel bearing surfaces which the ends of springs 45 contact. The wheel is preferably tapered over the outer portions of the radius thereof such that the side portions 53 and 54 define an included angle a therebetween. The circumferential outer edge 55 of the wheel preferably has a small radius on it so that this edge is not sharp.

The flanges 33 and 34 that are located adjacent the ends of the beam 32 have threaded apertures therein. Shoulder screws 56 in the elongated slots 41 of the arms 29 and 30 are threaded into these apertures in the flanges 33 and 34 to rotatably attach the arms to beam 32.

The frame 27 is mounted under the conveyor 15 by bolting the leg 37 of beam 32 to a cross member 57 of a structure supporting the conveyor 15 and lead trimmer 18 (see FIG. 3). The member 57 and frame 27 are positioned and oriented so that the wheel 25 is located close to and in front of the leading edge 22 of the cutting disk 17 and is orthogonal to a plane through line A—A and containing the top surface 19 of the disk 17. A crossbar 58 is located in the support structure to provide a bearing surface for the adjustment screw 38 in order to hold the frame 27 and wheel 25 in place.

In order to provide for adjustment of the position of the wheel 25, a support member 59 having an adjustment screw 60 threaded through an aperture thereof is rotatably supported on flange 35 by a shoulder screw 61. A swivel shoe assembly 62 on the other end of the adjustment screw 60 is rigidly secured to the crossbar 31, e.g., by screws. The position of the wheel 25 may then be moved in either of the directions of the double-headed arrow 65 by loosening the shoulder screws 56 and turning the nut 63 that is welded onto the adjustment screw 60. Additional movement of the frame 27 and thus the wheel 25 is obtained by rotation of the screw 38 against the rigidly supported member 58. When the wheel 25 is in the desired position, the locknut 39 on adjustment screw 38 is tightened against crossbar 31, the shoulder screws 56 are tightened to fix the position of the frame 27, and a locknut (not shown) on adjustment screw 60 is tightened against the member 59.

The uppermost point on the circumference of the wheel 25 is preferably set to be in a plane through line B—B containing the underside 20 of a flat circuit board 11 as it is carried in conveyor 15. This plane B—B is parallel to the plane A—A containing the top surface 19 of cutting disk 17 and is spaced a height $h$ above the latter. Thus, the top of wheel 25 is spaced above the cutting disk a distance $h$ which is equal to the length that it is desired to cut the component leads 13. The distance $d$ between the leading edge 22 of the cutting disk 17 and a point on the wheel 25 and in the plane A—A is also adjusted by movement of screws 38 and 60. This distance $d$ is preferably maintained at a small value.

In operation, the top of the wheel 25 is located above the cutting disk a height $h$, which is preferably equal to the desired length to which component leads are to be cut. The wheel 25 is also spaced a distance $d$ from the leading edge of disk 17 so that the wheel cannot contact the latter. Circuit boards 11 in conveyor 15 are moved in the direction of arrow 16 toward lead trimmer 18. The undersides 20 of boards 11 that are bowed downward will be below the plane of line B—B and may also be below the plane of line A—A. When such a bowed circuit board 11 reaches the leading edge of wheel 25, the board will ride up onto the wheel and cause the latter to rotate clockwise. Since the position of wheel 25 is fixed, the underside 20 of the bowed PC board 11 is raised into the plane of line B—B which contains the top of the wheel. This means that the underside 20 of the board will pass above the leading edge 22 of cutting disk 17. In this manner, the disk 17 cuts the component leads 13 to approximately the desired length $h$ and is effectively prevented from contacting the underside 20 of board 11. Since the distance $d$ between the wheel and the disk is small, the length of trimmed leads 13 depending from the underside 20 of the bowed or warped board 11 will keep the latter from contacting the cutting disk 17 as the board moves off of the wheel.

It is desirable that the wheel 25 not ride over a projection such as a component lead 13 on the bottom of a circuit board 11 since this would raise the underside 20 thereof above the plane of line B—B and cause component leads 13 to be cut to different lengths. This condition is prevented by the tapering side portions 53 and 54 of wheel 25 and by loosely mounting the wheel on shaft 26 with weak compression springs 45. If the wheel 25 hits a component lead 13, the lead will contact the tapered portions 53 and 54 on the sides of the wheel. Movement of the board will then cause the lead 13 to produce increasing transverse pressure on the wheel 25. Since the force exerted on the wheel 25 by the springs 45 is very small, the transverse pressure produced by lead 13 causes the wheel to move sideways on shaft 26 and out of the path of the lead. In addition, the wheel may wobble slightly to initiate sideways movement thereof when it contacts an obstruction. The clearance between the shaft and the inner diameter of the bearing must be quite large to permit the desired wobble action.

Figure 2:
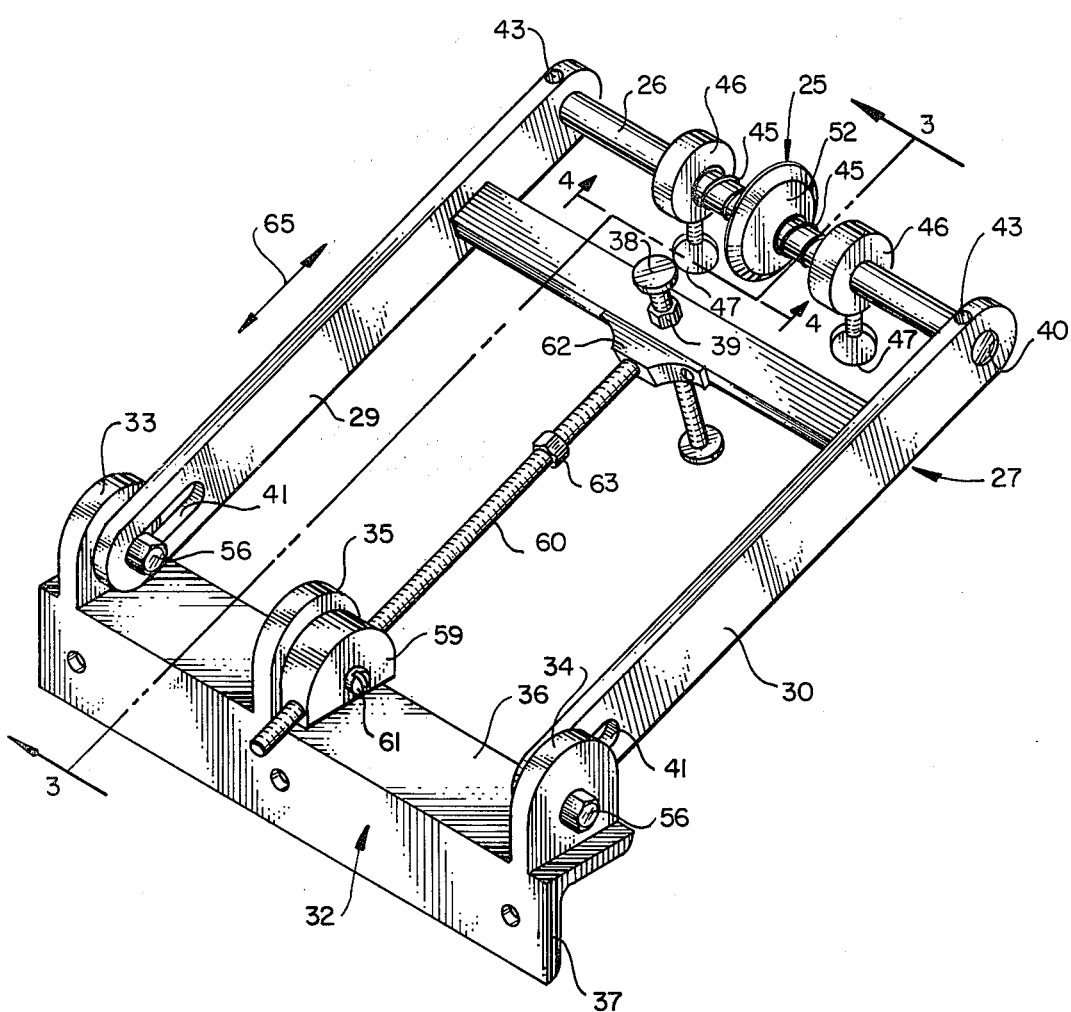
FIG. 2 is a perspective view of the frame structure 27 in FIG. 1.

In a structure that was built and operated, the wheel 25 was made of stainless steel and had a diameter of 2 inches, a thickness of 0.335 inch at the center thereof, an angle $a$ of 25° from the vertical, a taper extending over the length $s = 5/16$ inch, and a 1/64 inch radius on the circumference 55 thereof. The clearance between the outside diameter of the shaft 26 and the inside diameter of a bearing in this wheel 25 was 1/32 inch. The springs 45 were made of 20-gauge music wire, contained five turns, and were approximately 1½ inches long in their free state. The frame 27 in this structure was slightly different from that illustrated in FIGS. 2 and 3 in that instead of employing the flange 35, support 59, adjacent screw 60, and swivel shoe assembly 62 for accomplishing movement of the wheel 25 in the directions of arrow 65, each of the arms 29 and 30 was divided into two mating parts as is illustrated in FIG. 5. The arm parts 29A and 29B were secured together by screws 73 and 74. The end 75 of arm part 29B had an elongated slot 76 in it to allow movement of part 29B, and thus wheel 25, in the directions of arrow 65.

Although this invention is described in relation to preferred embodiments thereof, variations and modifications thereof will occur to those skilled in the art without departing from the spirit of this invention. By way of example, the wheel 25 may be positioned in other than the center of shaft 26, and more than one wheel 25 may be located on the same or more than one shaft and in front of one or more cutting disks. In addition, a wheel 25 may be located in line with the cutting disk for similarly supporting the undersides of printed circuit boards as they pass over the trailing edge of the disk 17, although such a structure has not been found to be necessary. In an automated system for accommodating printed circuit boards that are wider than the diameter of the cutting disk 17, two or more cutting disks may be offset from each other with the top surfaces thereof in the same plane, the conveyor moving circuit boards over the plurality of cutting disks. In such an arrangement, one or more wheels may be located in front of each of the cutting disks. Although the conveyorized assembly line operation is described here as occurring in a horizontal plane, these operations may take place with the various elements having different orientations. Although the side portions 53 and 54 of the wheel 25 are flat in a section view of the preferred embodiment thereof that is described here, one or both of these side portions may instead be regular or irregular curves surfaces over a portion of or most of the full radius of the wheel. These curved surfaces are preferably convex, although this is not required. Also, both sides of the wheel may have different shapes and be other than symmetrical about the axis of rotation of the wheel. The circumferential edge 55 of the wheel in a section view containing the axis of rotation of the wheel may also be rounded with a curve that is other than circular or be flat. The major consideration here is that the circumference of the wheel have a small finite breadth so that it does not damage circuit patterns on a board. Further, different structures may be employed for adjusting or varying the position of the wheel 25 in relation to the leading edge of the cutting disk. In addition, a skid that is wedge shaped, for example, may be nonrotatably mounted on the shaft 26 with means providing for lateral movement thereof. The scope of this invention is to be determined from the appended claims rather than the above detailed description of preferred embodiments thereof.

What is claimed is:

1. In equipment for trimming component leads protruding from one side of a printed circuit board to a prescribed length when measured from the one side of a flat circuit board that is in a first plane, the equipment including a flat cutting disk arranged for rotation about an axis perpendicular to the first plane and having one surface adjacent to the first plane and being in a second plane that is parallel to and spaced from the first plane a prescribed distance that is equal to the prescribed length, and first means for moving circuit boards over the disk with at least a portion of edges of the one side of the board in the first plane and component leads projecting away from the one side of the circuit board in the direction of the second plane, the IMPROVEMENT comprising:

a wheel having an axis of rotation, a pair of sides, a circumferential outer edge, and having a thickness that is variable and which decreases in magnitude in the direction of the circumference of said wheel over at least a portion of the length of the radius thereof;

means rotatably supporting said wheel in front of the cutting disk in the direction of movement of circuit boards and for rotation in the same direction, said wheel being supported with a point on the circumference thereof located in the first plane, the remainder of said wheel being located on the side of the first plane that is in the direction of the second plane; a transverse force in the direction of the axis of rotation of said wheel being produced thereon when said wheel contacts an obstruction such as a component lead; and means holding said wheel in a prescribed position along the axis of rotation thereof when transverse force on said wheel in the direction of the axis thereof is less than a prescribed force and allowing lateral movement of said wheel along its axis of rotation only when a transverse force on said wheel exceeds the prescribed force; moving circuit boards that are bowed from the first plane in the direction of the second plane having the one side thereof contacting said wheel as the board moves over it for causing said wheel to rotate and to raise the one side of a bowed circuit board above the leading edge of the cutting disk.

2. The improvement according to claim 1 wherein said circumferential outer edge is flat.

3. The improvement according to claim 1 wherein said circumferential outer edge is rounded.

4. The improvement according to claim 1 wherein the thickness of said wheel is much less than the diameter thereof.

5. The improvement according to claim 1 wherein at least one side of said wheel in a vertical section thereof containing its axis of rotation comprises a flat segment on either side of, inclined with respect to, and symmetrical with respect to the axis of rotation of said wheel.

6. The improvement according to claim 5 wherein both sides of said wheel are symmetrical about a third plane which is orthogonal to the axis of rotation of said wheel.

7. The improvement according to claim 5 wherein the two segments of the one side of said wheel are curved and are symmetrical with respect to the axis of rotation thereof.

8. The improvement according to claim 7 wherein both sides of said wheel are symmetrical about a third plane which is orthogonal to the axis of rotation of said wheel.

9. The improvement according to claim 1 wherein said supporting means comprises a cylindrical shaft in a central aperture of said wheel, said shaft and aperture being dimensioned for providing a loose fit therebetween whereby said wheel may wobble and slide freely on said shaft when a transverse force greater than the prescribed force is produced on said wheel such as when said wheel contacts an object such as a component lead projecting from the one side of the circuit board.

10. The improvement according to claim 9 wherein said holding means comprises a lightly preloaded compression spring on either side of said wheel for enabling lateral transverse axial movement of said wheel on said shaft when a transverse force on said wheel exceeds the prescribed force set by said springs.

11. The improvement according to claim 10 including means for adjusting the position of said point on the circumference of said wheel with respect to the first plane.

12. The improvement according to claim 11 including second means for moving the position of said wheel with respect to the leading edge of the cutting disk, when viewed in relation to the direction of movement of the board.

13. The improvement according to claim 1 wherein at least one side of said wheel is shaped like at least a portion of the surface of a cone over at least a portion of the diameter of said wheel.

14. The improvement according to claim 13 wherein the conically shaped surface on the one side of said wheel is located proximate the circumference thereof.

15. The improvement according to claim 14 wherein both sides of said wheel are similarly shaped and are symmetrical about a third plane that is orthogonal to the axis of rotation of said wheel.

16. The improvement according to claim 15 wherein the circumferential outer edge of said wheel is flat.

17. The improvement according to claim 16 wherein straight lines on the circumferential outer edge of said wheel are parallel to the axis of rotation thereof.

18. The improvement according to claim 15 wherein the circumferential outer edge of said wheel is rounded.

19. The improvement according to claim 1 wherein at least one side of said wheel is curved over at least a portion of the radius of said wheel and is symmetrical about the axis of rotation thereof.

20. The improvement according to claim 19 wherein the curved portion of the one side of said wheel is generally convex.

21. The improvement according to claim 19 wherein the curved portion of the one side of said wheel is located proximate the circumference thereof.

22. The improvement according to claim 21 wherein both sides of said wheel are similarly shaped and are symmetrical about a third plane that is orthogonal to the axis of rotation of said wheel.

23. The improvement according to claim 22 wherein the circumferential outer edge of said wheel is flat.

24. The improvement according to claim 23 wherein straight lines on the circumferential outer edge of said wheel are parallel to the axis of rotation thereof.

25. The improvement according to claim 22 wherein the circumferential outer edge of said wheel is rounded.

26. The improvement according to claim 6 wherein associated segments of each side of said wheel define an included angle of less than 100°.

27. In equipment for trimming component leads protruding from one side of a printed circuit board to a prescribed length when measured from the one side of a flat printed circuit board that is in a first plane, the equipment including a flat cutting disk arranged for rotation about an axis perpendicular to the first plane and having one surface adjacent to the first plane and being in a second plane that is parallel to and spaced from the first plane a prescribed distance that is equal to the prescribed length and first means for moving circuits boards past this disk with at least a portion of edges of the one side of each board in the first plane and component leads projecting away from the one side of the circuit board in the direction of the second plane, the improvement comprising a wheel having variable thickness that decreases in magnitude over at least a portion of the length of its radius in the direction of the circumference thereof for converting a force on said wheel in the direction of movement of a board to a transverse force in the direction of the axis of rotation of said wheel which is located in front of the disk for lateral movement transverse to the direction of movement of circuit boards only in response to a transverse force on said wheel that is greater than a prescribed force and with a point on the circumference thereof in the first plane, the remainder of said wheel being on the side of the first plane that is in the direction of the second plane, moving printed circuit boards that are bowed in the direction of the second plane having the one side thereof contacting said wheel as the board moves past the latter wheel for causing said wheel to rotate and to move the one side of the board into the first plane prior to its passing the leading edge of the cutting disk.

28. In equipment for trimming component leads protruding from one side of a printed circuit board to a prescribed length when measured from the one side of a flat printed circuit board that is in a first plane, the equipment including a flat cutting disk arranged for rotation about an axis perpendicular to the first plane and having one surface adjacent to the first plane and being in a second plane that is parallel to and spaced from the first plane a prescribed distance that is equal to the prescribed length, and first means for moving circuit boards past the disk with at least a portion of edges of the one side of a board in the first plane and component leads projecting away from the one side of the board in the direction of the second plane, the improvement comprising:

second means in front of the leading edge of the cutting disk in the direction of movement of boards and having at least one point thereof in the first plane, other points of said second means being located on the side of the first plane that is in the direction of the second plane, for moving the one side of a circuit board in the first plane and bowed in the direction of the second plane into the first plane as the board moves past said one point and thereby spacing the one side of the circuit board from the leading edge of the cutting disk in the second plane as the board moves past the disk, said second means being configured with a variable thickness increasing in the direction from the one point thereon toward the second plane for producing a transverse force thereon which is orthogonal to the direction of travel of the circuit board when said second means contacts an obstruction such as a component lead projecting from the one side of the board, and third means supporting said second means for allowing lateral movement of said second means only in response to a transverse force on said second means that is greater than a prescribed value.

29. The improvement according to claim 1 wherein said wheel is supported with the point on the circumference thereof located in a third plane that is between and parallel to the first and second planes.

30. The improvement according to claim 27 wherein said wheel is supported with the point on the circumference thereof located in a third plane that is between and parallel to the first and second planes.

31. The improvement according to claim 28 wherein the said one point of said second means is in a third plane that is between and parallel to the first and second planes.

* * * * *